(12) United States Patent
Isobe (10) Patent No.: US 9,000,430 B2
(45) Date of Patent: Apr. 7, 2015

(54) EL DISPLAY DEVICE AND METHOD FOR PRODUCING SAME (71) Applicant: Panasonic Corporation, Osaka (JP)

(72) Inventor: Takashi Isobe, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/357,269

(22) PCT Filed: Nov. 16, 2012

(86) PCT No.: PCT/JP2012/007385
§ 371 (c)(1),
(2) Date: May 9, 2014

(87) PCT Pub. No.: WO2013/076948
PCT Pub. Date: May 30, 2013

(65) Prior Publication Data
US 2014/0312337 A1 Oct. 23, 2014

(30) Foreign Application Priority Data

Nov. 24, 2011 (JP) .................................. 2011-256668

(51) Int. Cl.
H01L 51/00 (2006.01)
H01L 51/50 (2006.01)
H01L 51/52 (2006.01)
(Continued)

(52) U.S. Cl.
CPC .......... *H01L 51/5088* (2013.01); *H01L 51/508* (2013.01); *H01L 51/5231* (2013.01); *H05B 33/10* (2013.01); *H01L 27/3279* (2013.01); *H01L 51/5012* (2013.01);
(Continued)

(58) Field of Classification Search
CPC ..................................................... H01L 51/508
See application file for complete search history.

(56) References Cited

U.S. PATENT DOCUMENTS 5,443,922 A 8/1995 Nishizaki et al.
2002/0158835 A1 10/2002 Kobayashi et al.
(Continued)

FOREIGN PATENT DOCUMENTS

JP 05-163488 6/1993
JP 2002-318556 10/2002
(Continued)

OTHER PUBLICATIONS

International Search Report (ISR) in International Patent Application No. PCT/JP2012/007385, dated Dec. 11, 2012.

*Primary Examiner* — Daniel Luke
(74) *Attorney, Agent, or Firm* — Greenblum & Bernstein, P.L.C.

(57) ABSTRACT

To provide a device whose life is less likely to be reduced by deterioration of a light-emitting layer material, an EL display device includes: a pixel electrode, for each pixel, above a substrate; auxiliary wiring in a different region, above the substrate, from the pixel electrode; a transition metal oxide layer on the pixel electrode and the auxiliary wiring; a light-emitting layer in a region, above the transition metal oxide layer, corresponding to the pixel; a common electrode continuously above the auxiliary wiring and the light-emitting layer, and electrically connected to the auxiliary wiring; and a material deterioration suppressing layer continuously on a portion of the transition metal oxide layer above the auxiliary wiring and the light-emitting layer, mainly containing barium, and having a thickness equal to or greater than a size of a single barium atom and smaller than 10 nm.

9 Claims, 6 Drawing Sheets (51) Int. Cl.
*H05B 33/10* (2006.01)
*H01L 27/32* (2006.01)
*H01L 51/56* (2006.01)

(52) U.S. Cl.
CPC ............ *H01L 51/56* (2013.01); *H01L 51/5212* (2013.01); *H01L 51/5253* (2013.01); *H01L 27/3248* (2013.01)

(56) References Cited

U.S. PATENT DOCUMENTS

| | | | |
|---|---|---|---|
| 2005/0012454 | A1 | 1/2005 | Yamazaki et al. |
| 2007/0029929 | A1 | 2/2007 | Nakamura et al. |
| 2007/0205718 | A1 | 9/2007 | Yamazaki et al. |
| 2009/0284141 | A1 | 11/2009 | Sakanoue et al. |
| 2009/0286445 | A1 | 11/2009 | Yamazaki |
| 2010/0051993 | A1 | 3/2010 | Shimoda et al. |
| 2010/0187513 | A1 | 7/2010 | Okumoto |
| 2010/0302221 | A1 | 12/2010 | Okumoto |
| 2011/0193107 | A1 | 8/2011 | Takeuchi |
| 2012/0074397 | A1 | 3/2012 | Okumoto |
| 2012/0178191 | A1 | 7/2012 | Sakanoue et al. |
| 2012/0199853 | A1* | 8/2012 | Konuma et al. ................. 257/88 |
| 2012/0228588 | A1* | 9/2012 | Mitsuya .......................... 257/40 |
| 2013/0299816 | A1* | 11/2013 | Bessho et al. ................... 257/40 |
| 2014/0159074 | A1 | 6/2014 | Isobe |

FOREIGN PATENT DOCUMENTS

| | | |
|---|---|---|
| JP | 2005-038833 | 2/2005 |
| JP | 2007-073499 | 3/2007 |
| JP | 2009-277788 | 11/2009 |
| JP | 2010-067349 | 3/2010 |
| JP | 2010-129346 | 6/2010 |
| JP | 2011-040167 | 2/2011 |
| JP | 2011-071139 | 4/2011 |
| WO | 2009/130858 | 10/2009 |
| WO | 2010/070798 | 6/2010 |

* cited by examiner

EL DISPLAY DEVICE AND METHOD FOR PRODUCING SAME

TECHNICAL FIELD

The present invention relates to EL display devices and methods for manufacturing the same, and, in particular, to technology for improving lifetime properties of EL display devices.

BACKGROUND ART

One example of EL display devices is an organic EL display device making use of electro-luminescence in organic materials. A top-emission type organic EL display device includes, for example, a pixel electrode formed on a substrate, and a hole injection layer, a hole transport layer, an organic light-emitting layer, an electron transport layer, and a common electrode stacked on the pixel electrode. In the organic EL display device having such a structure, in order to prevent voltage drop produced in the common electrode with increasing size of a screen of the device, auxiliary wiring electrically connected to the common electrode is formed in a region, above the substrate, in which the pixel electrode is not formed (Patent Literature 1).

In a process of forming the layers of the above-mentioned organic EL display device, for example, the pixel electrode and the auxiliary wiring, which are made of an alloy of Al and Ag, are formed by sputtering, the hole injection layer, which is made of transition metal oxide, is also formed by sputtering, the hole transport layer and the organic light-emitting layer, which are made of a polymeric material, are formed by printing, the electron transport layer, which is made of a low-molecular material, is formed by evaporation, and the common electrode, which is made of transparent metal oxide such as indium tin oxide (ITO), is also formed by evaporation or sputtering. Further, the pixel electrode, which is formed for each pixel, and the hole transport layer and the organic light-emitting layer, which are formed by printing, are patterned, whereas the hole injection layer, the electron transport layer, and the common electrode are formed as a continuous film, or a so-called "solid film", without being patterned, as there is no need to form these layers for each pixel, and it is not easy to pattern these layers formed by evaporation and sputtering with high precision. By thus omitting patterning, a manufacturing process has been simplified.

CITATION LIST

Patent Literature

Patent Literature 1

Japanese Patent Application Publication No. 2002-318556

SUMMARY OF INVENTION

Technical Problem

Meanwhile, deterioration of a material for the organic light-emitting layer leads to a decrease in brightness, resulting in a reduced life of the organic EL display device. One of the major factors of the deterioration of the material is accumulation of charges in the organic light-emitting layer. The organic light-emitting layer emits light by excitons generated by combination of holes injected from the pixel electrode and electrons injected from the common electrode. If electrons or holes are accumulated in the organic light-emitting layer, a local bias of charges occurs, leading to local polarization. An electric field generated by the local polarization ends up separating the excitons into holes and electrons. With a decrease in the number of excitons, light-emitting efficiency decreases, and thus it becomes necessary to increase the amount of current. A rise in temperature of the organic light-emitting layer caused by the increase in the amount of current deteriorates the material for the organic light-emitting layer.

Such accumulation of charges is caused when there is a large difference in carrier mobility between electrons and holes in the organic light-emitting layer. Electron mobility is especially low in an organic light-emitting layer emitting blue light with a wide band gap, and in an organic light-emitting layer formed of a polymeric material having a polymeric structure in which holes and electrons are repeatedly transported and combined. Therefore, in these organic light-emitting layers, accumulation of charges is prominent, and the material is likely to deteriorate.

The present invention has been conceived in light of the above-described problem, and aims to provide an EL display device whose life is less likely to be reduced by deterioration of a material for a light-emitting layer, and a method for manufacturing the EL display device.

Solution to Problem

In order to achieve the above-mentioned aim, an EL display device pertaining to one embodiment of the present invention is an EL display device, including: a pixel electrode provided, for each pixel, above a substrate; auxiliary wiring provided in a region, above the substrate, different from a region in which the pixel electrode is provided; a transition metal oxide layer provided at least on the pixel electrode and on the auxiliary wiring; a light-emitting layer provided at least in a region, above the transition metal oxide layer, corresponding to the pixel; and a common electrode provided continuously above the auxiliary wiring and above the light-emitting layer, and electrically connected to the auxiliary wiring, wherein a material deterioration suppressing layer is provided continuously on a portion of the transition metal oxide layer above the auxiliary wiring and on the light-emitting layer, the material deterioration suppressing layer containing barium as a major component, and having a thickness that is equal to or greater than a size of a single barium atom and is smaller than 10 nm.

A method for manufacturing an EL display device pertaining to one embodiment of the present invention is a method for manufacturing an EL display device, including: forming, for each pixel, a pixel electrode above a substrate; forming auxiliary wiring in a region, above the substrate, different from a region in which the pixel electrode is formed; forming a transition metal oxide layer continuously on the pixel electrode and on the auxiliary wiring; forming a light-emitting layer at least in a region, above the transition metal oxide layer, corresponding to the pixel; forming a material deterioration suppressing layer continuously on a portion of the transition metal oxide layer above the auxiliary wiring and on the light-emitting layer, the material deterioration suppressing layer containing barium as a major component, and having a thickness that is equal to or greater than a size of a single barium atom and is smaller than 10 nm; and forming a common electrode above the material deterioration suppressing layer, the common electrode being electrically connected to the auxiliary wiring.

Advantageous Effects of Invention

In the EL display device pertaining to one embodiment of the present invention, the material deterioration suppressing layer containing barium as a major component is formed on the light-emitting layer, and thus a material for the light-emitting layer is less likely to deteriorate. This is because the material deterioration suppressing layer containing barium as a major component has a low electron level. Therefore, a barrier of injection into the light-emitting layer is low, and electrons are easily injected into the light-emitting layer. Further, the material deterioration suppressing layer contains therein large quantities of free electrons. Therefore, when such a layer is formed on the light-emitting layer, charges accumulated in the light-emitting layer are allowed to escape into the material deterioration suppressing layer. Accordingly, charges are less likely to accumulate in the light-emitting layer, and a material for the light-emitting layer hardly deteriorates. The material deterioration suppressing layer can suppress deterioration of a material for the light-emitting layer even if it is extremely thin. The effect of suppressing the deterioration, however, increases with increasing thickness of the material deterioration suppressing layer.

Furthermore, since the thickness of the material deterioration suppressing layer is 10 nm or smaller, even when the material deterioration suppressing layer and the transition metal oxide layer are each formed as a solid film, a wiring portion that is the portion of the material deterioration suppressing layer above the auxiliary wiring does not serve as an insulating film, and passage of current between the auxiliary wiring and the common electrode is less likely to be prevented. That is to say, when the material deterioration suppressing layer and the transition metal oxide layer are each formed as a solid film, these layers can be in contact with each other above the auxiliary wiring. In such a case, barium in the wiring portion of the material deterioration suppressing layer is oxidized to barium oxide upon receiving oxygen supply from the transition metal oxide layer, and the wiring portion becomes highly resistive. If the thickness of the material deterioration suppressing layer is 10 nm or greater in this case, the highly-resistive wiring portion serves as an insulating film, and thus passage of current between the auxiliary wiring and the common electrode is prevented. On the other hand, when the thickness of the material deterioration suppressing layer is smaller than 10 nm, passage of current is ensured by tunnel current even if the wiring portion becomes highly resistive.

The method for manufacturing the EL display device pertaining to one embodiment of the present invention includes a step of forming the material deterioration suppressing layer as described above. Thus, by using the method for manufacturing the EL display device pertaining to one embodiment of the present invention, an EL display device whose life is less likely to be reduced by deterioration of a material for the light-emitting layer can be manufactured. In addition, since the transition metal oxide layer is formed continuously on the pixel electrode and on the auxiliary wiring, and the material deterioration suppressing layer is formed continuously on the portion of the transition metal oxide layer above the auxiliary wiring and on the light-emitting layer, a manufacturing process can be simplified.

DESCRIPTION OF EMBODIMENT

The following describes an EL display device and a method for manufacturing the EL display device pertaining to one embodiment of the present invention, with reference to the drawings.

Summary of One Embodiment of Present Invention

An EL display device pertaining to one embodiment of the present invention is an EL display device, including: a pixel electrode provided, for each pixel, above a substrate; auxiliary wiring provided in a region, above the substrate, different from a region in which the pixel electrode is provided; a transition metal oxide layer provided at least on the pixel electrode and on the auxiliary wiring; a light-emitting layer provided at least in a region, above the transition metal oxide layer, corresponding to the pixel; and a common electrode provided continuously above the auxiliary wiring and above the light-emitting layer, and electrically connected to the auxiliary wiring, wherein a material deterioration suppressing layer is provided continuously on a portion of the transition metal oxide layer above the auxiliary wiring and on the light-emitting layer, the material deterioration suppressing layer containing barium as a major component, and having a thickness that is equal to or greater than a size of a single barium atom and is smaller than 10 nm.

In one specific aspect of the EL display device pertaining to one embodiment of the present invention, the thickness of the material deterioration suppressing layer is equal to or greater than 5 nm.

In another specific aspect of the EL display device pertaining to one embodiment of the present invention, an organic functional layer containing barium is provided on the material deterioration suppressing layer, and the common electrode contains metal oxide. In a further specific aspect, barium concentration in the organic functional layer is 5 wt % or higher.

In another specific aspect of the EL display device pertaining to one embodiment of the present invention, the light-emitting layer emits blue light, and the light-emitting layer has a thickness of 70 nm or greater and 90 nm or smaller.

In another specific aspect of the EL display device pertaining to one embodiment of the present invention, the light-emitting layer emits blue light, and current density per unit area in the light-emitting layer is 30 mA/cm$^2$ or higher and 40 mA/cm$^2$ or lower.

In another specific aspect of the EL display device pertaining to one embodiment of the present invention, the transition metal oxide layer contains molybdenum or tungsten.

In another specific aspect of the EL display device pertaining to one embodiment of the present invention, the transition metal oxide layer is a hole injection layer.

In another specific aspect of the EL display device pertaining to one embodiment of the present invention, the light-emitting layer contains an organic polymeric material.

When the organic polymeric material is used for the light-emitting layer, electron mobility in the light-emitting layer increases as the organic polymeric material has a block having an electron transport function within molecules. Considering the carrier balance and the recombination in the light-emitting layer, the thickness of the light-emitting layer is an important factor. Thus, when the light-emitting layer has a predetermined thickness, deterioration of the light-emitting layer can further be suppressed.

A method for manufacturing an EL display device pertaining to one embodiment of the present invention is a method for manufacturing an EL display device, including: forming, for each pixel, a pixel electrode above a substrate; forming auxiliary wiring in a region, above the substrate, different from a region in which the pixel electrode is formed; forming a transition metal oxide layer continuously on the pixel electrode and on the auxiliary wiring; forming a light-emitting layer at least in a region, above the transition metal oxide layer, corresponding to the pixel; forming a material deterioration suppressing layer continuously on a portion of the transition metal oxide layer above the auxiliary wiring and on the light-emitting layer, the material deterioration suppressing layer containing barium as a major component, and having a thickness that is equal to or greater than a size of a single barium atom and is smaller than 10 nm; and forming a common electrode above the material deterioration suppressing layer, the common electrode being electrically connected to the auxiliary wiring.

[EL Display Device]

Figure 1:
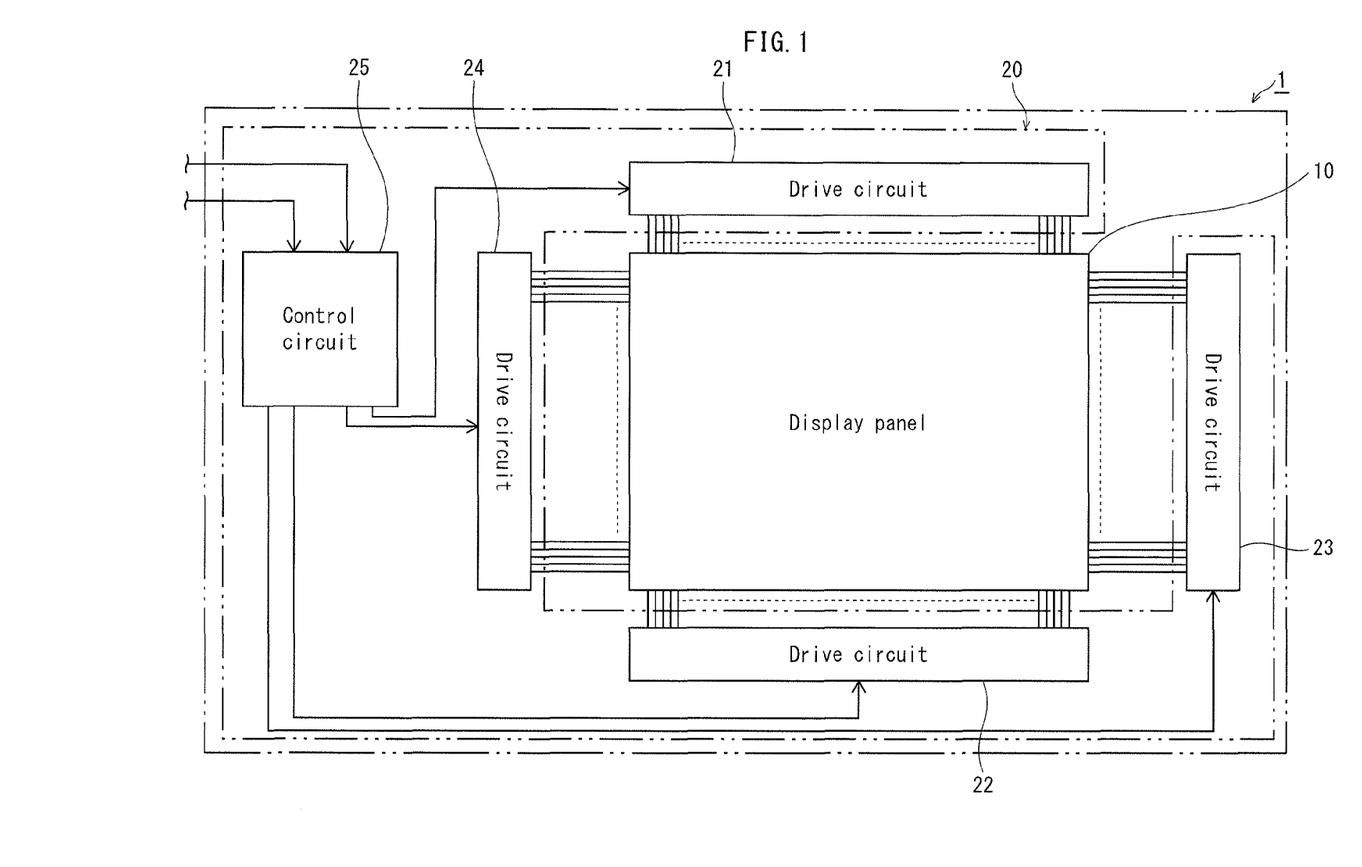
FIG. 1 shows an overall structure of an EL display device pertaining to one embodiment of the present invention.

FIG. 1 shows an overall structure of an EL display device pertaining to one embodiment of the present invention. As shown in FIG. 1, an EL display device 1 pertaining to one embodiment of the present invention is an organic EL display device including a display panel 10 and a drive control unit 20 connected to the display panel 10. The EL display device pertaining to one embodiment of the present invention is not limited to an organic EL display device, and may be any EL display devices including an inorganic EL display device.

The drive control unit 20 includes four drive circuits 21-24 and a control circuit 25. In the EL display device 1, the drive control unit 20 does not necessarily have to be arranged and connected with respect to the display panel 10 as illustrated in FIG. 1.

Figure 2:
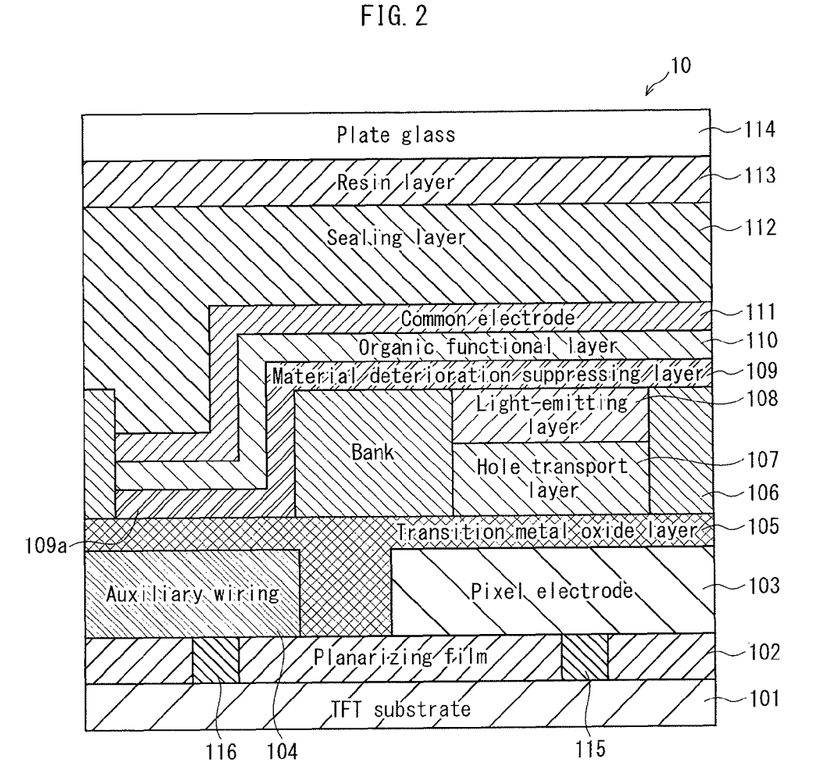
FIG. 2 is schematic sectional view of a display panel pertaining to one embodiment of the present invention.

FIG. 2 is schematic sectional view of the display panel pertaining to one embodiment of the present invention. The display panel pertaining to one embodiment of the present invention is a top-emission type organic display panel in which pixels corresponding to respective RGB colors are arranged in lines or in a matrix. As illustrated in FIG. 2, each pixel has a stacked structure in which a planarizing film 102, a pixel electrode 103, auxiliary wiring 104, a transition metal oxide layer 105, a bank 106, a hole transport layer 107, an light-emitting layer 108, a material deterioration suppressing layer 109, an organic functional layer 110, a common electrode 111, a sealing layer 112, a resin layer 113, and a glass plate 114 are stacked on a TFT substrate 101.

The TFT substrate 101 is, for example, a thin-film transistor array substrate including a base substrate and a drive circuit formed on the base substrate. An example of a material for the base substrate is an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

The planarizing film 102 is formed on the TFT substrate 101, and has a function to planarize an uneven surface of the TFT substrate 101. Examples of a material for the planarizing film 102 are an organic material such as an acrylic resin, a polyimide resin, and a novolac type phenolic resin, and an inorganic material such as silicon oxide ($SiO_2$) and silicon nitride ($Si_3N_4$).

The pixel electrode 103 is a reflecting anode formed, for each pixel, above the substrate (strictly, on the planarizing film 102) in a matrix or in lines. The pixel electrode 103 includes a metal film made of ACL, and a transparent conductive film made of IZO stacked on the metal film. The structure of the pixel electrode 103 is not limited to the above-described structure, and the pixel electrode 103 may be a monolayer of: an alloy such as ACL, APC (an alloy of silver, palladium, and copper), ARA (an alloy of silver, rubidium, and gold), MoCr (an alloy of molybdenum and chromium), and NiCr (an alloy of nickel and chromium); a transparent conductive material such as indium zinc oxide (IZO) and ITO; and a metal such as aluminum and silver. Alternatively, the pixel electrode 103 may be a stack of a plurality of layers selected from among layers of alloys, transparent conductive materials, and metals listed above.

The auxiliary wiring 104 is formed in a region, above the substrate, different from a region in which the pixel electrode 103 is formed, and electrically connected to the common electrode 111. Specifically, the auxiliary wiring 104 is formed, for each row of pixels, in lines along a direction of an array of pixel electrodes 103. The auxiliary wiring 104 has a structure in which a transparent conductive film made of IZO is stacked on a metal film made of ACL. The structure of the auxiliary wiring 104 is not limited to the above-described structure, and the auxiliary wiring 104 may be a monolayer of: an alloy such as ACL, APC, ARA, MoCr, and NiCr; a transparent conductive material such as IZO and ITO; and a metal such as aluminum and silver. Alternatively, the auxiliary wiring 104 may be a stack of a plurality of layers selected from among layers of alloys, transparent conductive materials, and metals listed above.

The pixel electrode 103 and the auxiliary wiring 104 are electrically connected to the TFT substrate 101 respectively via contact holes 115 and 116.

The transition metal oxide layer 105 is a solid film formed continuously on the pixel electrode 103 and on the auxiliary wiring 104, and serves as a hole injection layer. The transition metal oxide layer 105 does not necessarily have to be formed continuously on the pixel electrode 103 and on the auxiliary wiring 104, and may be formed at least on the pixel electrode 103 and on the auxiliary wiring 104. When the transition metal oxide layer 105 is formed continuously as a sold film, however, a manufacturing process can be simplified.

Examples of a material for the transition metal oxide layer 105 are a transition metal and an oxide of an alloy of transition metals. The transition metals here refer to group 3 elements to group 11 elements in the periodic table. Among transition metals, tungsten, molybdenum, nickel, titanium, vanadium, chromium, manganese, iron, cobalt, niobium, hafnium, tantalum are preferred, as these transition metals have high hole injection properties after being oxidized. Tungsten and molybdenum are particularly preferred to form the transition metal oxide layer 105 having high hole injection properties, as the transition metal oxide layer 105 having oxygen deficiencies is easily formed by sputtering in the presence of oxygen.

The bank 106 is made for example of an organic material such as an acrylic resin, a polyimide resin, and a novolac type phenolic resin, and an inorganic material such as $SiO_2$ and $Si_3N_4$, and defines a region corresponding to each pixel. In the region corresponding to each pixel, namely, in the region defined by the bank 106, the hole transport layer 107 and the light-emitting layer 108 are stacked in this order. Further, the material deterioration suppressing layer 109, the organic functional layer 110, the common electrode 111, and the sealing layer 112 are stacked in this order so as to be continuous with respective layers of an adjacent pixel, passing over the region defined by the bank 106, i.e., as solid films.

The hole transport layer 107 is formed on the transition metal oxide layer 105 in the region defined by the bank 106, and has a function to transport holes injected from the pixel electrode 103 into the light-emitting layer 108. Examples of a material for the hole transport layer 107 are PEDOT-PSS (poly(3,4-ethylenedioxythiophene) doped with a polystyrene sulfonic acid) and derivatives (e.g. copolymers) of PEDOT-PSS.

The light-emitting layer 108 is formed above the transition metal oxide layer 105 (strictly, on the hole transport layer 107) in the region defined by the bank 106, and serves as an organic light-emitting layer emitting light by making use of electro-luminescence. An example of an organic material for the light-emitting layer 108 is F8BT(poly(9,9-di-n-octylfluorene-alt-benzothiadiazole)), which is an organic polymer. The organic material for the light-emitting layer 108, however, is not limited to F8BT, and may be any known organic materials. The known organic materials are for example fluorescent materials such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. 5-163488.

The material deterioration suppressing layer 109 is formed continuously on a portion of the transition metal oxide layer 105 above the auxiliary wiring 104 and on the light-emitting layer 108 as a solid film. The material deterioration suppressing layer 109 contains barium as a major component, and has a function to suppress deterioration of the organic material for the light-emitting layer 108. Containing barium as a major component means herein that the material deterioration suppressing layer 109 may not be made only of barium. The material deterioration suppressing layer 109 may, of course, contain a compound other than barium as an impurity, and may also contain a compound other than barium to such a degree that a function to allow electrons accumulated in the light-emitting layer 108 to escape into the material deterioration suppressing layer 109 is not lost. Furthermore, a portion of the material deterioration suppressing layer 109 being in contact with the transition metal oxide layer 105 may be oxidized to barium oxide.

An appropriate material is sought as a material for a layer for injecting charges into the light-emitting layer 108, i.e., a layer having an interface with the light-emitting layer 108, depending on properties of a material for the light-emitting layer 108.

For example, the present inventors have found that, when a polymeric EL material is used as a material for the light-emitting layer 108, a layer made of a material having an energy level of approximately 2.5 eV is preferred as the layer for injecting charges into the light-emitting layer 108, as the energy level of the material matches an energy level of LUMO of the light-emitting layer 108, and, as a result, a barrier of electron injection can be reduced.

Use of a material having free electrons as the material for the layer for injecting charges into the light-emitting layer 108 mitigates accumulation of holes in the vicinity of an interface between the light-emitting layer 108 and the layer for injecting charges into the light-emitting layer 108, as large quantities of free electrons exist at the interface. As a result, local polarization is suppressed, preventing material fracture or exciton deactivation (exciton-polaron interaction). From the above-mentioned standpoint, alkali metals and alkaline-earth metals fall under preferred materials. From among alkali metals and alkaline-earth metals, studies have been conducted particularly on Na, Ba, and Cs.

First, Na is originally unstable, and thus is preferably used in the form of NaF, which is fluoride. It is also preferred that a material having a reduction action, such as Al, be stacked on a layer made of NaF so that Na is found in large quantities at an interface between the light-emitting layer 108 and the layer made of NaF. However, it is assumed that, when an electron injection layer made of Ba, the organic functional layer 110 containing Ba, and the common electrode 111 made of ITO are stacked on a layer made of the material having the reduction action, for example, effective Ba concentration decreases due to an action of Ba contained in the organic functional layer 110 on reduction of Na, and, as a result, formation of CT complex for improving injection properties from ITO is prevented, leading to lowering charge injection properties from ITO. It is also assumed that interconnection resistance increase between the auxiliary wiring 104 and the common electrode 111, as several times more atoms than multiply-charged ions are oxidized at a junction between the auxiliary wiring 104 and the layer made of NaF with tungsten oxide therebetween. For example, as for monovalent Na in NaF, two ions are used for ionic bond relative to two bivalent negative ions.

The present inventors have also found that Cs has properties to diffuse toward the light-emitting layer 108 by passage of current, and causes deterioration of the properties.

As a result of the above-mentioned studies, the inventors have reached a conclusion that Ba is preferred from the standpoints of a contact with the auxiliary wiring 104, stability at the interface with the light-emitting layer 108, electron injection properties, and mass productivity. Ba is also preferred in terms of industrial stability and easiness to handle.

The material deterioration suppressing layer 109 is, for example, almost uniform in overall thickness, and has a thickness that is equal to or greater than a size of a single barium atom and is equal to or smaller than 10 nm. When the material deterioration suppressing layer 109 having a thickness that is equal to or greater than a size of a single barium atom is formed, that is, when the material deterioration suppressing layer 109 is formed even if it is extremely thin, electrons are less likely to accumulate in the light-emitting layer 108, and thus a life of the EL display device 1 is less likely to be reduced by deterioration of the material for the light-emitting layer 108. In addition, since the thickness of the material deterioration suppressing layer 109 is equal to or smaller than 10 nm, even if a wiring portion of the material deterioration suppressing layer 109 (a portion of the material deterioration suppressing layer 109 above the auxiliary wiring 104) is oxidized by being in contact with the transition metal oxide layer 105, passage of current between the auxiliary wiring 104 and the common electrode 111 is ensured as the wiring portion 109a does not serve as an insulating film.

As apparent from experiments described later, when the thickness of the material deterioration suppressing layer 109 is equal to or greater than 3 nm, a significant effect of suppressing reduction in life of the EL display device 1 is produced, and, when the thickness of the material deterioration suppressing layer 109 is equal to or greater than 5 nm, the effect of suppressing reduction in life of the EL display device 1 is more significant.

The organic functional layer 110 is formed on the material deterioration suppressing layer 109 as a solid film, and has a function of an electron transport layer that transports electrons injected from the common electrode 111 to the light-emitting layer 108. Examples of a material for the organic functional layer 110 are barium, phthalocyanine, lithium fluoride, and a mixture of two or more of them. The organic functional layer 110 may not be formed as a solid film. When the organic functional layer 110 is formed as a solid film, however, a manufacturing process can be simplified.

The common electrode 111 is formed continuously above the auxiliary wiring 104 and above the light-emitting layer 108 (specifically, on the organic functional layer 110) as a solid film, and electrically connected to the auxiliary wiring 104. In the case of a top-emission type display panel, the common electrode 111 is preferably made of a light-transmissive material, such as ITO and IZO.

The sealing layer 112 is formed on the common electrode 111, and has a function to prevent the light-emitting layer 108 from being exposed to moisture and gas. In the case of a top-emission type display panel, the sealing layer 112 is preferably made of a light-transmissive material, such as silicon nitride (SiN) and silicon oxynitride (SiON).

The resin layer 113 is made of a dense resin material (e.g. silicone resin, acrylic resin), and formed between the sealing layer 112 and the glass plate 114. The resin layer 113 has a function to prevent the light-emitting layer 108 and other layers from being exposed to moisture and gas.

[Method for Manufacturing EL Display Device]

Figure 3:
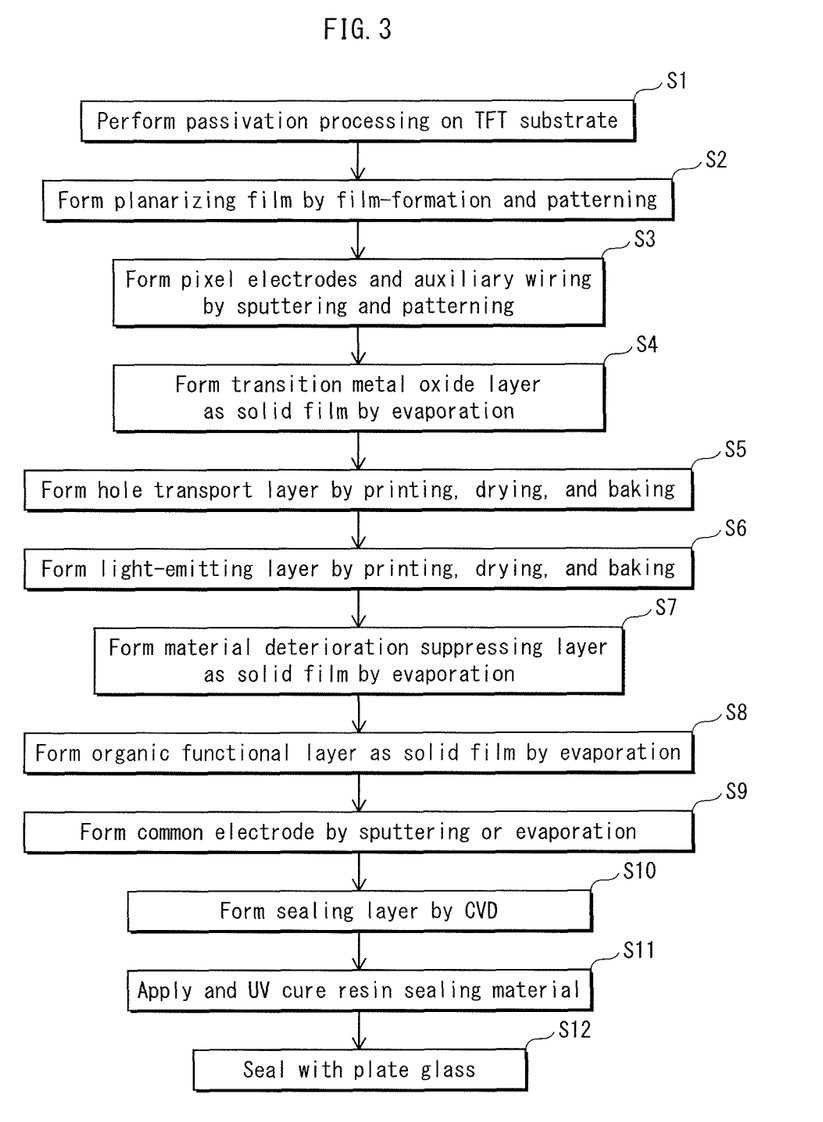
FIG. 3 is a process chart for explaining a process of manufacturing the EL display device pertaining to one embodiment of the present invention.

The method for manufacturing the EL display device pertaining to one embodiment of the present invention is characterized by a process of forming a display panel. Description is made only on a process of manufacturing the display panel below. FIG. 3 is a process chart for explaining a process of manufacturing the EL display device pertaining to one embodiment of the present invention.

As shown in FIG. 3, in the process of forming the display panel, the TFT substrate 101 is prepared first, and a surface thereof undergoes passivation processing (step S1).

Next, a resin film is formed on the TFT substrate 101 by spin coating. The resin film is patterned by photoresist/photoetching (PR/PE) to form the planarizing film 102 having a thickness of 4 μm (step S2).

Next, an ACL layer is formed on the planarizing film 102 by sputtering, and is patterned by PR/PE to form a matrix of metal layers each having a thickness of 400 nm. Further, an IZO layer is formed by vacuum evaporation, and is patterned by PR/PE to form metal oxide layers each having a thickness of 16 nm. As a result, the pixel electrodes 103 and the auxiliary wiring 104 each having a two-layer structure of the metal layer and the metal oxide layer are formed (step S3).

Next, a solid film is formed continuously on the pixel electrode 103 and on the auxiliary wiring 104 by sputtering to form the transition metal oxide layer 105 having a thickness of 5 nm (step S4).

Next, for example, the bank 106 having a lattice shape in a plan view is formed on the transition metal oxide layer 105, and then a region defined by the bank 106 is filled with ink containing a material for a hole transport layer by an ink jet method. A film thus formed by printing is dried, and baked to form the hole transport layer 107 having a thickness of 10 nm (step S5).

Next, for example, a region, on the hole transport layer 107, defined by the bank 106 is filled with ink containing a material for the organic light-emitting layer by an ink jet method. A film thus formed by printing is dried, and baked to form the light-emitting layer 108 having a thickness of 70 nm to 90 nm (step S6). The method for filling the region with ink is not limited to the ink jet method, and may be a dispenser method, a nozzle coating method, a spin coating method, an intaglio printing method, a relief printing method, and other methods.

Next, for example, a solid film made of metal barium is formed continuously on the bank 106 and the light-emitting layer 108 by vacuum evaporation to form the material deterioration suppressing layer 109 having a thickness of 5 nm to 10 nm (step S7).

Next, for example, a solid film containing 5 wt % of barium and made of a material having electron transport properties is formed on the material deterioration suppressing layer 109 by vacuum evaporation to form the organic functional layer 110 having a thickness of 35 nm (step S8).

Next, for example, a solid film made of ITO is formed on the organic functional layer 110 by vacuum evaporation to form the common electrode 111 having a thickness of 35 nm (step S9).

Next, the sealing layer 112 having a thickness of 0.5 μm to 7 μm is formed on the common electrode 111 by CVD (step S10).

Next, a resin sealing material is applied and then cured by being irradiated with UV (step 11). A plate glass is placed on the cured resin sealing material for sealing (step S12).

The top-emission type display panel is completed in the above-stated manner.

EXPERIMENTS (Experiment 1) Effect of Material Deterioration Suppressing Layer on Deterioration of Material for Light-emitting Layer A reduced life of an organic EL display device is caused by a decrease in brightness, that is, a decrease in light-emitting efficiency (external quantum efficiency). One of the major factors of the decrease in light-emitting efficiency is deterioration of a material for the light-emitting layer. A degree of the deterioration of the material for the light-emitting layer can be evaluated based on internal quantum efficiency of the light-emitting layer. The internal quantum efficiency can quantitatively be known by measuring PL intensity. In order to examine the effect of the material deterioration suppressing layer on the deterioration of the material for the light-emitting layer, the inventors prepared an EL display device not including a material deterioration suppressing layer, an EL display device including a material deterioration suppressing layer having a thickness of 5 nm, and an EL display device including a material deterioration suppressing layer having a thickness of 10 nm, and measured PL intensity of each of the EL display devices. Note that the structure of each of the EL display devices used in the experiments conforms to the structure of the EL display device 1 pertaining to the above-mentioned embodiment, and each of the EL display devices used in the experiments and the EL display device 1 pertaining to the above-mentioned embodiment have common structure except for the thickness of the material deterioration suppressing layer.

Figure 4:
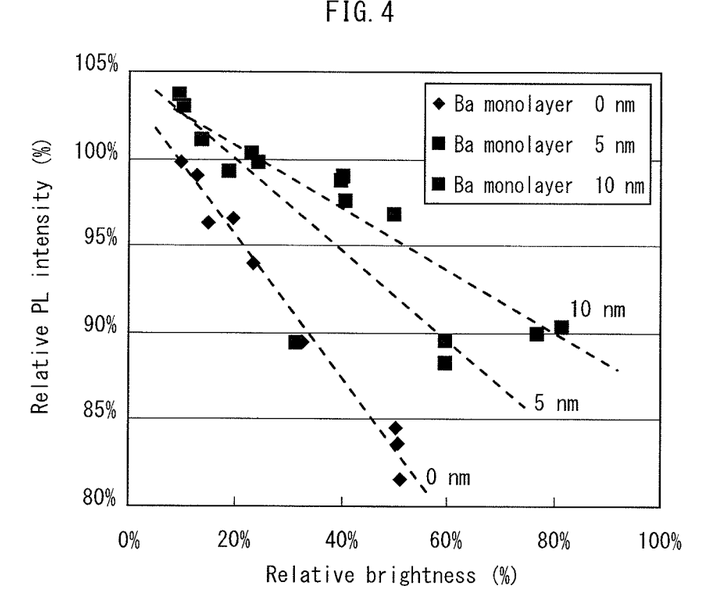
FIG. 4 shows the effect of a material deterioration suppressing layer on deterioration of a material for a light-emitting layer.

FIG. 4 shows the effect of the material deterioration suppressing layer on deterioration of the material for the light-emitting layer. In FIG. 4, relative PL intensity on the Y-axis indicates PL intensity relative to PL intensity at the start of measurement as 100%. Relative brightness on the X-axis indicates brightness relative to brightness at the start of normal driving by passage of current as 100%. "Ba monolayer 0 nm", "Ba monolayer 5 nm", and "Ba monolayer 10 nm" respectively indicate a case where the material deterioration suppressing layer is not formed, a case where the material deterioration suppressing layer having a thickness of 5 nm is formed, and a case where the material deterioration suppressing layer having a thickness of 10 nm is formed.

As shown in FIG. 4, comparison of relative PL intensity when relative brightness is 50%, for example, demonstrates that relative PL intensity in the case where the material deterioration suppressing layer is not formed is approximately 83%, whereas relative PL intensity in the case where the material deterioration suppressing layer having a thickness of 5 nm is formed is approximately 92%, and relative PL intensity in the case where the material deterioration suppressing layer having a thickness of 10 nm is formed is approximately 95%. As described above, deterioration of a material for the light-emitting layer is assumed to be suppressed by the presence of the material deterioration suppressing layer, as the effect of the deterioration of the material for the light-emitting layer on a decrease in brightness are reduced in the case where the material deterioration suppressing layer is formed.

Further, the effect of suppressing deterioration of a material for the light-emitting layer is assumed to increase with increasing thickness of the material deterioration suppressing layer, as relative PL intensity is higher in the case where the material deterioration suppressing layer having a thickness of 10 nm is formed than in the case where the material deterioration suppressing layer having a thickness of 5 nm is formed.

(Experiment 2) Insulating Properties of Wiring Portion of Material Deterioration Suppressing Layer Next, in order to confirm the effect of the thickness of the material deterioration suppressing layer on the insulating properties of the wiring portion of the material deterioration suppressing layer, the inventors prepared devices each including a short circuit in which a hole transport layer, a light-emitting layer, and a bank are not formed, and checked conductivity between auxiliary wiring and the common electrode of each of the devices. Specifically, each of the devices includes a planarizing film, a pixel electrode, the auxiliary wiring, a transition metal oxide layer, a material deterioration suppressing layer, an organic functional layer, and the common electrode stacked on a TFT substrate.

Figure 5:
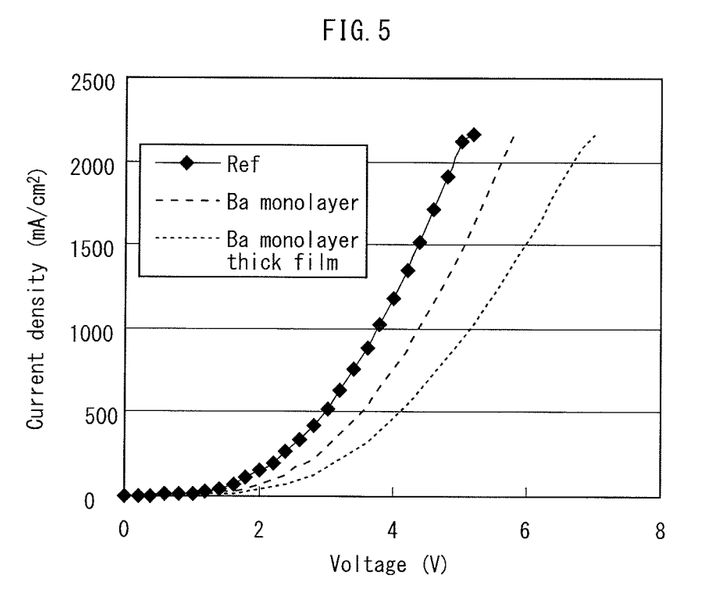
FIG. 5 shows the effect of the thickness of the material deterioration suppressing layer on insulating properties of a wiring portion.

FIG. 5 shows the effect of the thickness of the material deterioration suppressing layer on the insulating properties of the wiring portion. In FIG. 5, "Ref", "Ba monolayer", and "Ba monolayer thick film" respectively indicate a case where the material deterioration suppressing layer 109 is not formed, a case where the material deterioration suppressing layer is formed, and a case where a thicker material deterioration suppressing layer is formed.

As shown in FIG. 5, conductivity was lower in the case where the material deterioration suppressing layer was formed than in the case where the material deterioration suppressing layer was not formed. Furthermore, the conductivity decreased with increasing thickness of the material deterioration suppressing layer. Thus, the insulating properties of the wiring portion are assumed to increase with increasing thickness of the material deterioration suppressing layer.

(Experiment 3) Lifetime Properties of EL Display Device

In order to confirm the effect of the thickness of the material deterioration suppressing layer on lifetime properties of the EL display device, EL display devices that were similar to those used in Experiment 1 were used to evaluate lifetime properties of these EL display devices.

Figure 6:
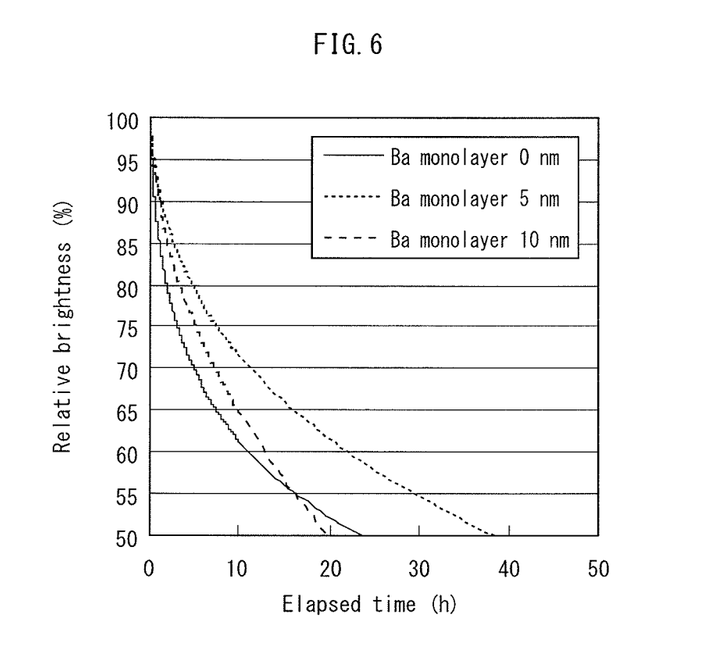
FIG. 6 shows the effect of the thickness of the material deterioration suppressing layer on lifetime properties of the EL display device.

FIG. 6 shows the effect of the thickness of the material deterioration suppressing layer on lifetime properties of the EL display device. In FIG. 6, relative brightness on the Y-axis is similar to that in Experiment 1. "Ba monolayer 0 nm", "Ba monolayer 5 nm", "Ba monolayer 10 nm" in FIG. 6 are also similar to those in Experiment 1.

As a result of driving the EL display devices over time while putting the same current load thereon, and measuring brightness of each of the EL display devices, the time until brightness was halved (time until relative brightness became 50%) was approximately 20 hours in the case where the material deterioration suppressing layer was not formed, whereas the time until brightness was halved was approximately 40 hours in the material deterioration suppressing layer having a thickness of 5 nm was formed, as shown in FIG. 6. The results suggest that the lifetime properties are improved by forming the material deterioration suppressing layer. It was found that there was a significant effect of improving the lifetime properties in the case where the thickness of the material deterioration suppressing layer was 5 nm, as the lifetime was doubled in that case. In a further experiment, it was found that similar lifetime properties to those obtained when the thickness of the material deterioration suppressing layer was 5 nm were obtained in the case where the thickness of the material deterioration suppressing layer is 3 nm.

In the case where the material deterioration suppressing layer having a thickness of 10 nm was formed, however, the time until brightness was halved was approximately 20 hours, which was almost equivalent to the time until brightness was halved in the case where the material deterioration suppressing layer was not formed. This means that a thicker material deterioration suppressing layer is not necessarily better, and there is an optimum range of the thickness of the material deterioration suppressing layer. It is assumed that reduction in life be caused in the case where the thickness of the material deterioration suppressing layer is 10 nm, because, by increasing the thickness to 10 nm, the wiring portion of the material deterioration suppressing layer becomes highly resistive and serves as an insulating film, and thus conductivity between the auxiliary wiring 104 and the common electrode 111 decreases, accelerating deterioration of a material for the light-emitting layer. It is also assumed that, since the material deterioration suppressing layer (Ba) is oxidized by deterioration of the interface caused due to passage of current, contact resistance on an electron injection path increase, and, as a result, electron injection properties to the light-emitting layer deteriorate.

(Experiment 4) Current Density for Obtaining Favorable Lifetime Properties

As earlier stated, a reduced life of an EL display device is caused by a decrease in light-emitting efficiency. Another factor significantly affecting the light-emitting efficiency is a carrier balance in the light-emitting layer. By optimizing the carrier balance in the light-emitting layer, the lifetime properties of the EL display device can be improved. Since the carrier balance can be evaluated by using the current density, once a range of the current density for obtaining favorable lifetime properties can be known, the lifetime properties can be improved by optimizing the carrier balance. To this end, the inventors prepared an EL display device having the structure conforming to the structure of the display device 1 pertaining to the above-mentioned embodiment, and investigated, in an experiment, the range of the current density for obtaining favorable lifetime properties. The EL display device used in the experiment includes a light-emitting layer emitting blue light, and an organic functional layer containing 5 wt % of barium.

Figure 7:
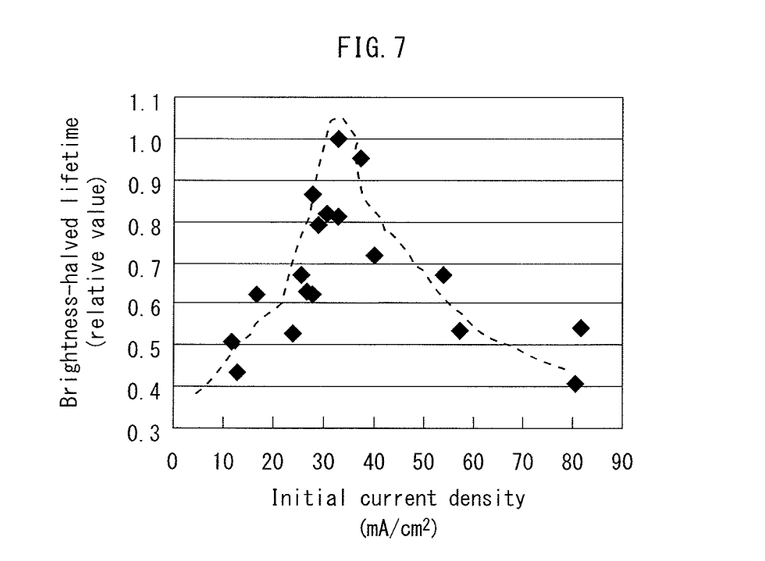
FIG. 7 shows a relation between current density and the lifetime properties.

FIG. 7 shows a relation between the current density and the lifetime properties. In FIG. 7, initial current density on the X-axis indicates initial current density per unit area when the light-emitting efficiency is maximized, and a brightness-halved lifetime on the Y-axis indicates a relative value of the time until brightness of the EL display device is halved. As a result of driving the EL display device over time while putting the same current load thereon, and measuring the current density and the brightness of the EL display device, favorable lifetime properties were obtained when the EL display device was driven at an operating point at which the current density is equal to or higher than 30 mA/cm$^2$ and equal to or lower than 40 mA/cm$^2$.

(Experiment 5) Thickness of Light-Emitting Layer for Obtaining Favorable Lifetime Properties Since the carrier balance is greatly affected by the thickness of the light-emitting layer, once a range of the thickness of the light-emitting layer for obtaining favorable lifetime properties can be known, the lifetime properties can be improved by optimizing the carrier balance. To this end, the inventors prepared an EL display device having the structure conforming to the structure of the display device 1 pertaining to the above-mentioned embodiment, and investigated, in an experiment, the range of the thickness of the light-emitting layer for obtaining favorable lifetime properties. The EL display device used in the experiment includes a light-emitting layer emitting blue light, and an organic functional layer containing 5 wt % of barium.

Figure 8:
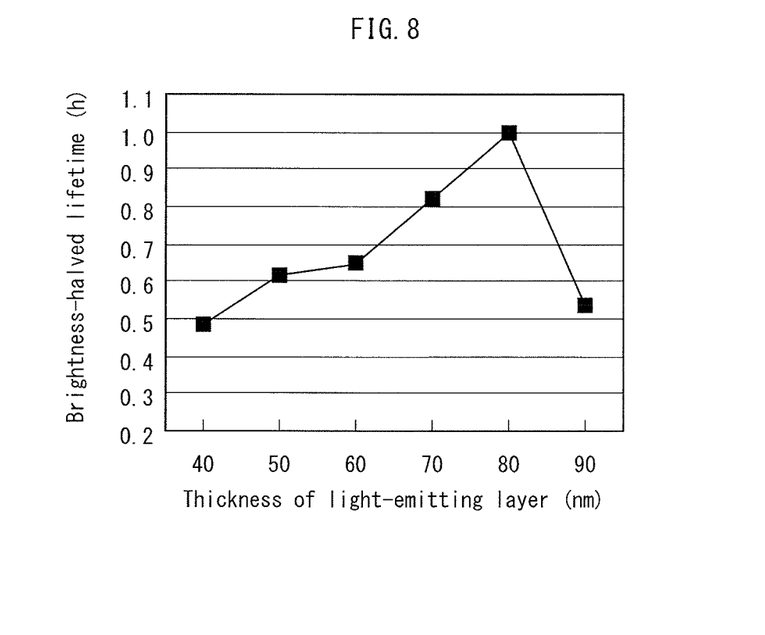
FIG. 8 shows a relation between the thickness of the light-emitting layer and the lifetime properties.

FIG. 8 shows a relation between the thickness of the light-emitting layer and the lifetime properties. In FIG. 8, a brightness-halved lifetime on the Y-axis indicates the time until brightness of the EL display device is halved. As a result of preparing a variety of EL display devices including light-emitting layers having different thickness, driving the EL display devices over time while putting the same current load thereon, and measuring the brightness of each the EL display devices, it was found that favorable lifetime properties were obtained when the thickness of the light-emitting layer was equal to or greater than 70 nm and equal to or smaller than 90 nm.

Figure 9:
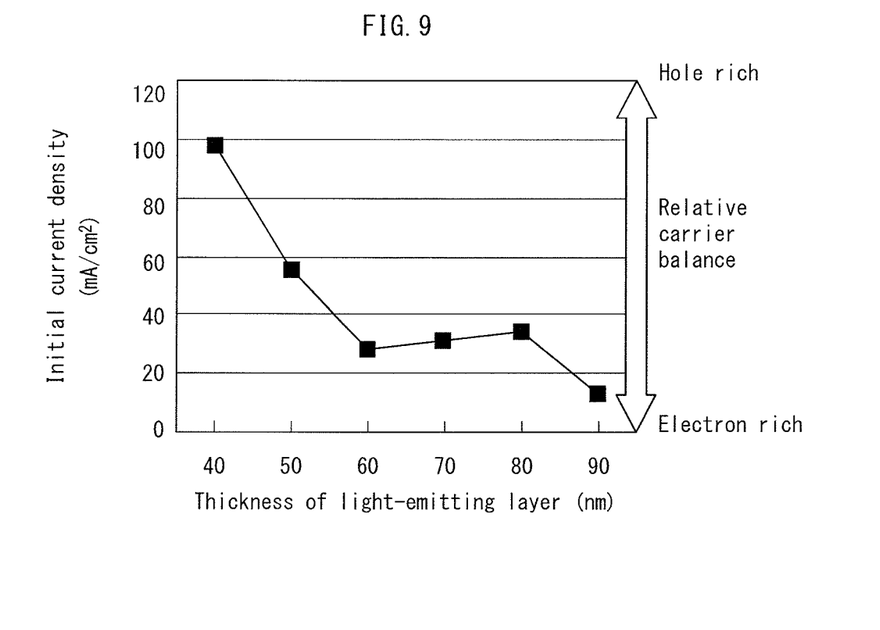
FIG. 9 shows a relation between the current density and the thickness of the light-emitting layer.

(Experiment 6) Relation Between Current Density and Thickness of Light-Emitting Layer The inventors finally confirmed a relation between the current density and the thickness of the light-emitting layer. FIG. 9 shows the relation between the current density and the thickness of the light-emitting layer. As shown in FIG. 9, it was confirmed from the results of Experiments 4 and 5 that the current density could be adjusted to be equal to or higher than 30 mA/cm$^2$ and equal to or lower than 40 mA/cm$^2$ when the thickness of the light-emitting layer was set to be equal to or greater than 70 nm and equal to or smaller than 90 nm.

Since an organic semiconductor typically has high electron mobility, when the thickness of the light-emitting layer is reduced, electrons do not contribute to recombination, and are likely to penetrate through interfaces. On the other hand, holes are less likely to penetrate through interfaces as they have lower mobility than electrons. For example, the relation between the initial current density and the brightness-halved lifetime as shown in a graph of FIG. 7 is considered to be determined largely by the quantity of electrons contributing to recombination. From this point of view, in a thin light-emitting layer, electrons exist but do not contribute to recombination. The thin light-emitting layer thus seems to be in a hole-rich state. On the other hand, in a thick light-emitting layer, the quantity of electron penetrating through interfaces is reduced, and more electrons contribute to recombination. It is thus considered that the thick light-emitting layer has shifted to an electron-rich state. Therefore, by increasing the thickness of the light-emitting layer, the light-emitting layer can be shifted to the electron-rich state, and the carrier balance can be improved.

The quantity of electric charges in the light-emitting layer is regulated by space charge limited current, and is proportional to the mobility and inversely proportional to the cube of the thickness. Since electron mobility and hole mobility are different from each other, contribution of the thickness is considered to be large.

An optimum relation between the carrier balance and the lifetime is considered next. In the hole-rich state, holes are accumulated at an interface between the light-emitting layer and the electron transport layer. On the other hand, in an electron-rich state, electrons are accumulated at an interface between the light-emitting layer and an injection layer. Such locally-accumulated charges cause material fracture and exciton deactivation at an interface, leading to a decrease in efficiency. Since a reduced life is caused by a decrease in efficiency over time due to passage of current, if the carrier balance is not at an optimum point in an initial state, locally-accumulated charges become marked, and efficiency decreases in a short period of time. As a result, a lifetime is reduced. Thus, by taking the carrier balance so as not to cause accumulation of charges at both interfaces, the lifetime can be improved.

MODIFICATION

Specific description has been made so far on the EL display device and the method for manufacturing the EL display device pertaining to one embodiment of the present invention. It should be noted that the above-mentioned embodiment is just an example used to give a clear explanation of the structure and the action/effects of the present invention, and thus the present invention is not limited to the above-mentioned embodiment.

INDUSTRIAL APPLICABILITY

The EL display device pertaining to one embodiment of the present invention is broadly applicable in the overall field of a passive matrix EL display device and an active matrix EL display device, for example.

REFERENCE SIGNS LIST

1 EL display device
103 pixel electrode
104 auxiliary wiring
105 transition metal oxide layer (hole injection layer)
108 light-emitting layer
111 common electrode
109 material deterioration suppressing layer
109a portion above auxiliary wiring (wiring portion)

The invention claimed is:

1. An EL display device, comprising:
a pixel electrode provided, for each pixel, above a substrate;
auxiliary wiring provided in a region, above the substrate, different from a region in which the pixel electrode is provided;
a transition metal oxide layer provided at least on the pixel electrode and on the auxiliary wiring;
a light-emitting layer provided at least in a region, above the transition metal oxide layer, corresponding to said each pixel; and
a common electrode provided continuously above the auxiliary wiring and above the light-emitting layer, and electrically connected to the auxiliary wiring, wherein
a material deterioration suppressing layer is provided continuously in physical contact with a portion of the transition metal oxide layer above the auxiliary wiring and in physical contact with the light-emitting layer, the material deterioration suppressing layer containing barium as a major component, and having a thickness that is equal to or greater than a size of a single barium atom and is smaller than 10 nm.

2. The EL display device of claim 1, wherein
the thickness of the material deterioration suppressing layer is equal to or greater than 5 nm.

3. The EL display device of claim 1, wherein
an organic functional layer containing barium is provided on the material deterioration suppressing layer, and
the common electrode contains metal oxide.

4. The EL display device of claim 1, wherein
the light-emitting layer emits blue light, and
the light-emitting layer has a thickness of 70 nm or greater and 90 nm or smaller.

5. The EL display device of claim 1, wherein
the light-emitting layer emits blue light, and
current density per unit area in the light-emitting layer is 30 $mA/cm^2$ or higher and 40 $mA/cm^2$ or lower.

6. The EL display device of claim 1, wherein
the transition metal oxide layer contains molybdenum or tungsten.

7. The EL display device of claim 1, wherein
the transition metal oxide layer is a hole injection layer.

8. The EL display device of claim 1, wherein
the light-emitting layer contains an organic polymeric material.

9. A method for manufacturing an EL display device, comprising:
forming, for each pixel, a pixel electrode above a substrate;
forming auxiliary wiring in a region, above the substrate, different from a region in which the pixel electrode is formed;
forming a transition metal oxide layer continuously on the pixel electrode and on the auxiliary wiring;
forming a light-emitting layer at least in a region, above the transition metal oxide layer, corresponding to said each pixel;
forming a material deterioration suppressing layer continuously in physical contact with a portion of the transition metal oxide layer above the auxiliary wiring and in physical contact with the light-emitting layer, the material deterioration suppressing layer containing barium as a major component, and having a thickness that is equal to or greater than a size of a single barium atom and is smaller than 10 nm; and
forming a common electrode above the material deterioration suppressing layer, the common electrode being electrically connected to the auxiliary wiring.

* * * * *